US009921483B2

(12) United States Patent
Dier et al.

(10) Patent No.: US 9,921,483 B2
(45) Date of Patent: Mar. 20, 2018

(54) SURFACE CORRECTION OF MIRRORS WITH DECOUPLING COATING

(71) Applicant: Carl Zeiss SMT GmbH, Oberkochen (DE)

(72) Inventors: Oliver Dier, Lauchheim (DE); Tobias Hackl, Langenau (DE); Franz-Josef Stickel, Aalen-Unterrombach (DE); Ulrich Loering, Schwaebisch Gmuend (DE); Tilmann Assmus, Aalen (DE); Juergen Mueller, Ulm (DE); Vladimir Kamenov, Essingen (DE); Siegfried Rennon, Westhausen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 11 days.

(21) Appl. No.: 14/981,018

(22) Filed: Dec. 28, 2015

(65) Prior Publication Data
US 2016/0209750 A1    Jul. 21, 2016

Related U.S. Application Data

(63) Continuation of application No. PCT/EP2014/062132, filed on Jun. 11, 2014.

(30) Foreign Application Priority Data

Jun. 27, 2013    (DE) .................. 10 2013 212 462

(51) Int. Cl.
*G03B 27/42*    (2006.01)
*G03F 7/20*    (2006.01)
(Continued)

(52) U.S. Cl.
CPC ........... *G03F 7/702* (2013.01); *G02B 5/0816* (2013.01); *G02B 5/0891* (2013.01);
(Continued)

(58) Field of Classification Search
CPC .. G02B 5/0816; G02B 5/0875; G02B 5/0891; G02B 5/22; G02B 27/141; G02B 27/145; G03F 7/70033; G03F 7/702
See application file for complete search history.

(56) References Cited

U.S. PATENT DOCUMENTS

2007/0091420 A1    4/2007 Hosoya et al.
2007/0091421 A1    4/2007 Hosoya et al.
(Continued)

FOREIGN PATENT DOCUMENTS

DE    102009017095 A1    10/2010
DE    102009032779 A1    1/2011
(Continued)

OTHER PUBLICATIONS

International Search Report and Written Opinion in counterpart International Application No. PCT/EP2014/062132, dated Jul. 28, 2014.

(Continued)

*Primary Examiner* — Mesfin Asfaw
(74) *Attorney, Agent, or Firm* — Edell, Shapiro & Finnan, LLC

(57) ABSTRACT

A mirror (1) for EUV lithography includes a substrate (2) and a reflective coating (3, 4). The reflective coating has a first group (3) of layers (3a, 3b) and a second group (4) of layers (4a, 4b), wherein the first group and second group of layers (3a, 3b; 4a, 4b) reflect radiation having a used wavelength between 5 nm and 30 nm. The first group of layers is arranged between the substrate and the second group of layers, and a decoupling coating (6) is arranged between the first group and second group of layers, said decoupling coating optically decoupling the second group of layers from the first group of layers by preventing the radiation having the used wavelength from reaching the first group of layers. The reflective coating preferably has a correction layer (5) having a layer thickness variation for correcting the surface form of the mirror.

20 Claims, 6 Drawing Sheets

(51) Int. Cl.
  *G02B 5/08* (2006.01)
  *G21K 1/06* (2006.01)
  *H05G 2/00* (2006.01)
  *G02B 27/00* (2006.01)

(52) U.S. Cl.
  CPC ......... *G02B 27/0025* (2013.01); *G03F 7/706* (2013.01); *G03F 7/70308* (2013.01); *G03F 7/70316* (2013.01); *G03F 7/70975* (2013.01); *G21K 1/062* (2013.01); *H05G 2/005* (2013.01)

(56) References Cited

U.S. PATENT DOCUMENTS

| | | |
|---|---|---|
| 2008/0259439 A1 | 10/2008 | Shiraishi |
| 2008/0266651 A1 | 10/2008 | Murakami et al. |
| 2012/0134015 A1 | 5/2012 | Paul et al. |
| 2012/0212810 A1 | 8/2012 | Paul et al. |
| 2012/0229784 A1 | 9/2012 | Rocktaeschel et al. |
| 2014/0078481 A1 | 3/2014 | Mueller et al. |

FOREIGN PATENT DOCUMENTS

| | | |
|---|---|---|
| DE | 102009029471 A1 | 3/2011 |
| DE | 102011005543 A1 | 9/2012 |
| EP | 1306698 A1 | 5/2003 |
| EP | 1947682 A1 | 7/2008 |
| WO | 9733203 A1 | 9/1997 |
| WO | 2012123240 A1 | 9/2012 |

OTHER PUBLICATIONS

Office Action in corresponding German Application No. 10 2013 212 462.7, dated Dec. 12, 2013, along with an English translation.

SURFACE CORRECTION OF MIRRORS WITH DECOUPLING COATING

CROSS-REFERENCE TO RELATED APPLICATIONS

This is a Continuation of International Application PCT/EP2014/062132, which has an international filing date of Jun. 11, 2014, and the disclosure of which is incorporated in its entirety into the present Continuation by reference. The following disclosure is also based on and claims the benefit of and priority under 35 U.S.C. § 119(a) to German Patent Application No. DE 10 2013 212 462.7, filed Jun. 27, 2013, which is also incorporated in its entirety into the present Continuation by reference.

FIELD OF THE INVENTION

The invention relates to a mirror for use in extreme ultraviolet (EUV) lithography, for example in a microlithographic projection exposure apparatus, comprising a substrate and a reflective coating. The invention also relates to a projection optical unit and an optical system for EUV lithography comprising at least one such mirror, a method for correcting the surface form of such a mirror and methods for correcting the imaging properties of such a projection optical unit.

BACKGROUND

Optical systems in the form of microlithographic projection exposure apparatuses serve for producing microstructured components by means of a photolithographic method. In this case, a structure-bearing mask, the so-called reticle, is imaged onto a photosensitive layer with the aid of a projection optical unit or a projection lens. The minimum feature size that can be imaged with the aid of such a projection optical unit is determined by the wavelength of the imaging light used. The shorter the wavelength of the imaging light used, the smaller the structures that can be imaged with the aid of the projection optical unit. Imaging light having the wavelength of 193 nm or imaging light having a wavelength in the range of the extreme ultraviolet (EUV), i.e. 5 nm-30 nm, is primarily used nowadays. When imaging light having a wavelength of 193 nm is used, both refractive optical elements and reflective optical elements are used within the microlithographic projection exposure apparatus. When imaging light having a wavelength in the range of 5 nm-30 nm is used, by contrast, exclusively reflective optical elements (mirrors for EUV lithography) are used.

The performance of an optical system, e.g. of a projection lens, comprising mirrors (in particular, but not exclusively, in EUV systems) is largely determined by the deviations between the system wavefront defined in the design and the system wavefront achieved in production. These deviations arise (alongside the contributions of mounting and alignment) primarily during the production of the individual components (mirrors) as a result of the accuracy of the optical production, of the coating and of the corresponding measurement techniques. If the stipulations regarding the accuracy of an individual mirror component or, as a result of the interaction of a plurality of defective mirror components, the specified wavefront sizes are not achieved in production, one or more mirrors must be exchanged or reworked until the overall system fulfills its specifications.

Various approaches are known for correcting wavefront contributions of individual (mirror) components or of an overall optical system:

WO 97/33203 describes an imaging optical system for UV radiation, wherein a reflective surface is provided with a correction layer which is transparent to radiation at the used wavelength and which is intended to compensate for unevennesses in the surface form of the reflective surface by means of a layer thickness variation in order to produce a correction of the wavefront in this way.

EP 1947682 describes a correction process for a mirror with a multilayer coating, wherein, by means of ion beam figuring (IBF) for example, a removal is effected in the topmost layers of the multilayer coating in order to produce a thickness distribution and to alter the wavefront. An intermediate layer composed of Si or an Si-containing material is applied to the part of the multilayer coating subjected to removal, and a protective layer having a substantially constant thickness is applied to the planar top side of the intermediate layer.

Although aberrations are corrected in both of the correction processes described above the reflectivity of the mirrors will vary greatly as a result of the processing near the surface, as a result of which the apodization is impaired. Moreover, the figuring of different layer materials (Mo and Si) e.g. by means of an ion beam as described in EP 1947682 constitutes a problem in terms of processing engineering: during the figuring, different removals and roughnesses of the layer materials result therefrom. In particular, the figuring in a molybdenum layer is typically disadvantageous since extensive roughening and oxidation generally occur in said layer.

US 2008/0259439 A1 describes the correction of the wavefront of a mirror by subjecting the layers of the reflective coating to radiation, in particular to laser radiation, for heating the layers. This makes use of the fact that the heating results in compaction of the layers, which leads to a reduction of the period length. The compaction of the layers results in a shift in the reflectivity spectra in the irradiated regions, as a result of which the apodization is likewise impaired.

US 2007/0091420 A1 and US 2007/0091421 A1 describe mirrors comprising a multilayer coating, wherein an intermediate layer composed of Si is arranged between a first group of layers and a second group of layers. A sputtering process is proposed for applying the layers, in which process the sputtered particles impinge on the substrate perpendicularly or at an angle.

DE 10 2009 029471 A1 describes a mirror comprising a substrate and a reflective coating. The reflective coating comprises a first group and a second group of layers, wherein the second group of layers is arranged between the first group of layers and the substrate. The layers of the first and second groups serve in each case for reflecting EUV radiation. The first group of layers comprises a number of layers that is greater than 20 such that, upon irradiation with radiation having a wavelength in the range of 5-30 nm, less than 20% of the radiation reaches the second group of layers. The second group of layers has a layer thickness variation for correcting the surface form of the mirror. In one exemplary embodiment, the second group of layers has a correction layer having a layer thickness variation which makes up more than 50% of the layer thickness variation of the second group of layers. The layer thickness variation in the correction layer can be produced by ion beam figuring for example. Since only approximately 20% of the incident radiation reaches the second group of layers, the combination of both groups of layers is intended not to have a significant effect on the reflectivity properties of the mirror.

SUMMARY

It is an object of the invention to improve the reflectivity properties of a mirror for EUV lithography with a corrected surface form, and to provide a projection optical unit and an optical system for EUV lithography comprising at least one such mirror. It is likewise an object of the invention to specify an improved method for correcting the surface form of such a mirror, and methods for correcting the imaging properties of a projection optical unit comprising at least one such mirror.

These and other objects are achieved in accordance with one aspect by a mirror for EUV lithography, comprising a substrate and a reflective coating, wherein the reflective coating comprises a first group of layers and a second group of layers, wherein the first and second group of layers are respectively configured for reflecting radiation having a used wavelength in the range of between 5 nm and 30 nm, wherein the first group of layers is arranged between the substrate and the second group of layers, and wherein a decoupling coating is arranged between the first group and second group of layers, said decoupling coating being configured to optically decouple the second group of layers from the first group of layers by preventing the incident (EUV-)radiation having the used wavelength of the second group of layers from reaching the first group of layers. A correction layer having a layer thickness variation for correcting the surface form of the mirror is preferably arranged between the first group of layers and the second group of layers.

The inventors have recognized that, in particular when introducing a correction layer into a reflective coating, as is described in DE 10 2009 029 471 A1, but also when introducing other (functional) layers, as a result of the two highly reflective groups of layers and the intervening (correction) layer, which is typically substantially transparent to the incident radiation, the problem occurs that a configuration arises which is similar to an etalon or a laser cavity in a VCSEL ("vertical cavity surface emitting laser"), that is to say that the wavelength-dependent reflectivity or the reflectivity spectrum of the mirror varies depending on the thickness of the (correction) layer. The greater the transparency of the second group of layers, which is adjacent to the interface with the surroundings, to the incident EUV radiation, the greater this effect becomes, i.e. the greater the extent to which the reflectivity spectrum varies. In particular, in the case of coatings having a small number of periods or of layers, for example fewer than 20 layers, this effect can lead to a constructive interference of the two groups of layers, which leads to a drastic change in the reflectivity spectrum in the case of which, if appropriate, two or more maxima of the reflectivity which do not correspond to the used wavelength can form.

For the case where less than 20% of the incident radiation reaches the first group of layers, this can already have a disadvantageous effect on the reflectivity properties of the mirror. In order to avoid a situation where radiation from the second group of layers can interact with the first group of layers through the (correction) layer, it is proposed to arrange a decoupling coating between the first and second group of layers in order to optically decouple the first and second group of layers. The term "optical decoupling" is understood to mean that practically no incident radiation reaches the first group of layers, i.e. the decoupling coating acts as a shield for the incident EUV radiation.

Ideally, 0% of the incident radiation should reach the first group of layers, but it is also sufficient, if appropriate, if the decoupling coating ensures that less than 5%, preferably less than 1%, of the incident radiation reaches the first group of layers. In this application, the term "decoupling coating" is also used for the case where only an individual decoupling layer is present. In general, the decoupling coating is applied homogeneously, i.e. it has a constant thickness. The optical decoupling of the two groups of layers with the aid of the decoupling coating can be effected in various ways:

In one embodiment, the decoupling coating has at least one absorption layer configured to absorb radiation having a used wavelength in the range between 5 nm and 30 nm. In this case, the absorption layer serves as a decoupling layer. For this purpose, the absorption layer comprises a material having a high absorption coefficient for EUV radiation, i.e. for radiation in the wavelength range of between approximately 5 nm and approximately 30 nm.

In one development, in particular for operation at 13.5 nm, the absorption layer is formed from a material selected from the group comprising: Ni, Ag, Ac, Te, Cu, Co, Sn, Zn, Pt, Au, W, Fe. These materials have a high absorption coefficient for EUV radiation at 13.5 nm.

In another development in particular for operation at 7 nm, the absorption layer is formed from a material selected from the group comprising: Al, Co, Cu, Ir, Os, Ni, Fe, Hf, Pt, Ta, W, Zn. These materials have a high absorption coefficient for EUV radiation at 7 nm.

In another development, the absorption layer consists not only of elements, but also of alloys or chemical compounds such as MoSi, CoSi, WSi, SiN, SiO, MoO, CoO, NiO.

In a further development, the absorption layer has a thickness of more than 50 nm, preferably of more than 100 nm. For completely shielding the first group of layers against radiation that penetrates into the second group of layers, the absorption layer or a plurality of absorption layers must be provided with a sufficient thickness.

In a further embodiment, the decoupling coating comprises a plurality of first layers and second layers arranged alternately one above another, preferably in a periodic arrangement wherein the first layers comprise a first material, the refractive index of which for radiation having a wavelength in the range of between 5 nm and 30 nm is greater than the refractive index of a second material, which the second layers comprise, and wherein the decoupling coating has a reflectivity maximum at a wavelength that deviates from the used wavelength by more than 2 nm, preferably by more than 3 nm. In this embodiment, it has proved to be advantageous if the plurality of first and second layers are present in a periodic arrangement, i.e. if the layer pairs each comprising a first and second layer that are arranged one above another have an identical thickness in each case, since the reflectivity curve falls very rapidly around the maximum of the reflectivity of the decoupling coating in this case.

In this embodiment, the decoupling coating is embodied as an EUV coating which, in particular in the case of a periodic arrangement of the layers, has (exactly) one reflectivity maximum, which deviates significantly from the used wavelength at which the second group of layers (and typically also the first group of layers) have a reflectivity maximum. If the reflectivity maximum of the decoupling coating lies significantly outside the wavelength range in which radiation is reflected by the second group of layers, it is possible to prevent the incident radiation from reaching the first group of layers. If the used wavelength is approximately 13.5 nm, for example, it has proved to be advantageous if the reflectivity maximum of the decoupling coating is, for example, approximately 11 nm or less or approximately 18 nm or higher.

In a further embodiment, the decoupling coating comprises a third group of layers, wherein the second and third groups of layers in each case comprise a plurality of first layers and second layers arranged alternately one above another in a periodic arrangement, wherein the first layers comprise a first material, the refractive index of which for radiation having a wavelength in the range of between 5 nm and 30 nm is greater than the refractive index of a second material, which the second layers comprise, wherein the total number of pairs comprising first and second layers in the second and third groups is more than 50, preferably more than 70.

This embodiment makes use of the fact that, given a sufficiently high number of layers or of layer pairs each comprising a first and a second layer, on account of reflection and absorption, EUV radiation practically no longer reaches the first group of layers. In this embodiment, the mirror has a periodic coating, i.e. a coating in which the layer pairs have in each case a constant thickness corresponding to the period length of the coating. As a result of such a periodic arrangement, it is possible to produce a highly reflective coating having a high reflectivity only in a very narrow wavelength range. The thickness of the reflective coating or of the layer pairs can vary in a location-dependent manner, if appropriate, for example in order to take account of the influence of the angle of incidence, which varies in a location-dependent manner, if appropriate, in the use of the mirror in an optical system.

In an alternative embodiment, the decoupling coating comprises a third group of layers, wherein the second and third groups of layers in each case comprise a plurality of first layers and second layers arranged alternately one above another in an aperiodic arrangement, wherein the first layers comprise a first material, the refractive index of which for radiation having a wavelength in the range of between 5 nm and 30 nm is greater than the refractive index of a second material, which the second layers comprise, and wherein the total number of layers in the second and third groups of layers is more than 50, preferably more than 80.

In this embodiment, the layers of the second and third groups are arranged aperiodically, i.e. the layer thicknesses of the first and respectively the second layers vary in the thickness direction. Such an aperiodic design is typically used to realize a so-called broadband coating which has a high reflectivity for wavelengths in a comparatively wide wavelength range or angular range of the EUV spectrum around the reflectivity maximum. In this case, too, as a result of reflection and absorption in the layers of the second and third groups of layers, it is possible to prevent the incident radiation from reaching the first group of layers.

In the two embodiments described above, having a periodic and an aperiodic arrangement of layers, the decoupling is achieved by virtue of the fact that, in addition to the layers of the second group, the number of which is chosen such that the desired reflectivity for the incident EUV radiation is achieved, a number of layers are added which do not contribute or contribute only slightly to an increase in the reflectivity of the second group of layers, but reduce the radiation intensity that reaches the first group of layers practically to zero, i.e. the additional layers of the third group fulfill the function of a decoupling coating. If the correction layer is arranged below the decoupling coating, the second and third group of layers can be applied in a common coating step. In general, the layer thicknesses and the layer materials of the second and third groups of layers correspond, i.e. the association of the layers with the second group and respectively with the third group cannot be distinguished.

In a further embodiment, the second group of layers comprises a number of layers, which is less than or equal to 20. In this case, the second group of layers is particularly transmissive to penetrating EUV radiation, such that the reflectivity properties of the mirror can be significantly improved by provision of a decoupling coating. The coating or the second group of layers having a number of layers of 20 or less is typically a broadband coating having a plurality of layers in a periodic arrangement. The broadband nature of the reflectivity curve is produced by the comparatively small number of layers in this case.

In a further embodiment, the material of the correction layer is selected from the group comprising: Si, $SiO_2$, SiC, C, Ru, Ni. These materials can be processed, for example, by ion beam figuring or the like in order to produce the layer thickness variation, without extensive roughening of the layer occurring during the processing. Layer thickness variations for correcting the surface form of the mirror are typically approximately of the order of magnitude of the used wavelength, i.e. —given a used wavelength of approximately 13.5 nm—the layer thickness variation is approximately of the order of magnitude of between approximately 1 nm and 15 nm.

For the case where the correction layer is formed from a material having a high absorption coefficient, said correction layer—given thickness of appropriate magnitude—can perform, if appropriate, the function of the decoupling coating, i.e. in this case a single layer can perform the function both of the correction layer and of the decoupling coating.

In a further embodiment, the correction layer adjoins the first group of layers or the second group of layers. In general, the correction layer adjoins the second group of layers in order, as a result of the processing of the correction layer, to perform a surface correction that corrects surface defects both of the first group of layers and of the decoupling coating. However, it is also possible to apply the correction layer to the topmost layer of the first group of layers. In this case, the decoupling coating is applied to the correction layer. This is advantageous, in particular, if the decoupling coating, as described above, is a third group of layers in a periodic or aperiodic layer arrangement, since otherwise the above-described effects on the reflectivity curve can arise, if appropriate, as a result of an optical coupling of the second and third groups of layers.

A further aspect of the invention relates to a projection optical unit for EUV lithography, comprising at least one mirror designed as described above, and to an optical system for EUV lithography comprising at least one such mirror. The optical system can be an EUV lithography apparatus for the exposure of a wafer or some other optical system which uses EUV radiation, for example a system for measuring masks used in EUV lithography or the like.

The invention likewise relates to a method for correcting a surface form of a mirror for EUV lithography, comprising a substrate and a reflective coating, the method comprising the following steps: applying a first group of layers of the reflective coating to the substrate, applying a second group of layers of the reflective coating to the first group of layers, wherein the first and second groups of layers are respectively configured to reflect radiation at a used wavelength in the range of between 5 nm and 30 nm, wherein after applying the first group of layers and before applying the second group of layers a decoupling coating for optically decoupling the first group and second group of layers by preventing the radiation having the used wavelength from reaching the first group of layers and preferably a correction layer (or, if appropriate, some other type of functional layer that is substantially transparent to the EUV radiation) are applied, and wherein correcting the surface form of the mirror comprises producing or altering a layer thickness variation of the reflective coating, in particular of the correction layer.

Such a method has the advantage that the surface form of the mirror can be set very accurately with a processing of the reflective coating, for example in the region of the first group of layers and/or by the processing of the correction layer. By way of example, more than 50% of the layer thickness variation for correcting the surface form of the mirror can arise as a result of the layer thickness variation of the correction layer, but it is also possible, if appropriate, to completely dispense with providing the correction layer. The decoupling coating serves for optically decoupling or shielding the first group of layers from EUV radiation that is intended to be reflected by the second group of layers. With the aid of the decoupling coating, a correction of the surface form or a wavefront correction can be performed without the reflectivity properties of the mirror being impaired in this case. The correction layer can be applied to the decoupling coating, but the converse case is also possible, i.e. firstly the correction layer and then the decoupling coating can be applied.

In one variant of the method, after applying the first group of layers and before applying the second group of layers the surface form of the mirror is measured. The surface form can be measured by an interferometric measurement method, for example, wherein the measurement is advantageously effected under conditions which correspond as well as possible to the use conditions for the mirror in an optical system. This concerns, in particular, the wavelength of the radiation used for the measurement. A mirror having a second group of layers which is configured to reflect radiation at a used wavelength between approximately 5 nm and approximately 30 nm is typically measured with radiation at a wavelength which likewise lies in this wavelength range and which corresponds, if appropriate (but not necessarily) to the used wavelength. The first group of layers is applied to the substrate in order to measure the surface form of the mirror at the used wavelength or at a wavelength deviating slightly therefrom.

In a further variant, producing or altering a layer thickness variation of the correction layer comprises ion beam figuring of the correction layer. In this variant, a local variation of the thickness of the correction layer is produced by a local removal of the layer material of the correction layer by an ion beam. Other processing methods can also be used for producing the layer thickness variation of the correction layer, provided that they enable a sufficiently great precision during the processing.

The invention furthermore relates to a method for correcting the imaging properties of a projection optical unit for EUV lithography, comprising an above-described method for correcting a surface form of at least one mirror of the projection optical unit. Such a method for correcting the imaging properties thus has the advantages described above with regard to the method for correcting a surface form.

The invention additionally relates to a method for correcting the imaging properties of a projection optical unit for EUV lithography, comprising the following steps:

determining the wavefront aberrations of the projection optical unit calculating a correction surface form of at least one mirror from the wavefront aberrations of the projection optical unit, correcting a surface form of at least one mirror according to the method described above.

Such a method for correcting the imaging properties has the advantages already described above with regard to the method for correcting a surface form.

Further features and advantages of the invention are evident from the following description of exemplary embodiments of the invention, with reference to the figures of the drawing and from the claims. The individual features can each be realized individually by themselves or as a plurality in any desired combination in a variant of the invention.

BRIEF DESCRIPTION OF THE DRAWINGS

Exemplary embodiments are illustrated in the schematic drawing and are explained in the following description. In the figures.

DETAILED DESCRIPTION

In the following description of the drawings, identical reference signs are used for identical or functionally identical component parts.

Figures 1A, 1B, 1C:
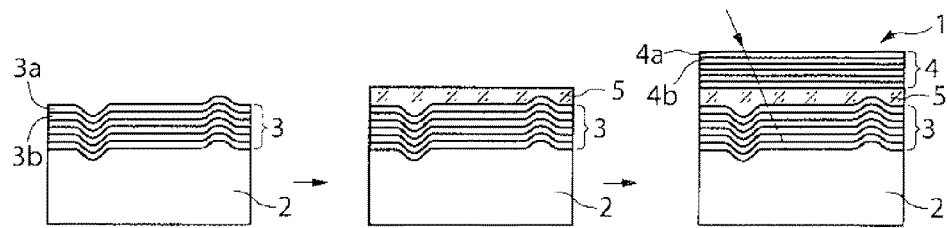
FIGS. 1A-1C show three steps of a method for producing a mirror for microlithography in accordance with the prior art, in which steps a first group of layers, a correction layer and a second group of layers are applied to a substrate.

FIGS. 1A-1C schematically illustrate three steps of a method for producing a mirror 1 (cf. FIG. 1C) for EUV lithography. The mirror 1 comprises a substrate 2 and a reflective coating, which in the present case is formed from a first group 3 of layers 3a, 3b and a second group 4 of layers 4a, 4b. A correction layer 5 is arranged between the first group 3 of layers 3a, 3b and the second group 4 of layers 4a, 4b.

In the present case, the mirror 1 is intended to be used in a projection exposure apparatus for EUV lithography which uses imaging light having a wavelength in the range of 5 nm-30 nm, typically at a used wavelength $\lambda_B$ of approximately 13.5 nm. In this case, the substrate 2 consists of a material having a very low coefficient of thermal expansion (CTE) of typically less than 100 ppb/K at 22° C. or over a temperature range of approximately 5° C. to approximately 35° C. One material which has these properties is silicate or quartz glass doped with titanium dioxide, typically having a silicate glass proportion of more than 90%. One such silicate glass that is commercially available is sold by Corning Inc. under the trade name ULE® (Ultra Low Expansion glass). A further group of materials having a very low coefficient of thermal expansion are glass ceramics in which the ratio of the crystal phase to the glass phase is set such that the coefficients of thermal expansion of the different phases virtually cancel one another out. Such glass ceramics are offered e.g. under the trade name Zerodur® from Schott AG or under the trade name Clearceram® from Ohara Inc.

Both the first layer group 3 and the second layer group 4 of the reflective coating of the mirror 1 have a plurality of individual layers 3a, 3b and 4a, 4b, respectively, which consist of different materials. If the mirror 1 is embodied for reflecting radiation having a wavelength in the range of 5 nm-30 nm, the second group 4 comprises a plurality of first layers 4a and a plurality of second layers 4b, which are mounted alternately one above another and which consist of materials having different refractive indices for radiation in the wavelength range specified above. If the used radiation has a used wavelength 4 in the region of 13.5 nm, then the first layers 4a usually consist of silicon (having a higher refractive index) and the second layers 4b of molybdenum (having a lower refractive index). Other material combinations such as e.g. molybdenum and beryllium, ruthenium and beryllium or lanthanum and $B_4C$ are—depending on the used wavelength—likewise possible.

The first group 3 of layers 3a, 3b can be configured analogously to the second group 4 of layers 4a, 4b, i.e. it can be configured to reflect radiation at the used wavelength $\lambda_B$ or can have a reflectivity maximum at the used wavelength $\lambda_B$. This is advantageous for the measurement of the surface form of the mirror 1 since measurement radiation whose wavelength corresponds to the used wavelength $\lambda_B$ can be used in this case. However, it is also possible to design the first group 3 of layers 3a, 3b for reflecting EUV radiation having wavelengths that deviate from the used wavelength $\lambda_B$.

In addition to the layers 3a, 3b, 4a, 4b shown in FIGS. 1A-1C, the first layer group 3 and/or the second layer group 4 can also comprise intermediate layers for preventing diffusion or coating layers for preventing oxidation and corrosion. In contrast to the illustration shown in FIGS. 1a-c, one or more auxiliary layers e.g. in the form of smoothing or polishing layers, layers for stress compensation, layers for protecting the substrate 2, etc. are arranged, if appropriate, between the substrate 2 and the first group 3 of layers 3a, 3b. The illustration of such auxiliary layers in the figures has been omitted.

In the example illustrated in FIGS. 1A-1C the mirror 1 has a substrate 2 having an (approximately) planar surface. This was chosen in this way merely for the sake of better illustration of the correction method described here. Even in the initial state, the mirror 1 or the top side of the substrate 2 can have a curved surface form. By way of example, concave surface forms and convex surface forms are possible. The surface forms can be both spherical and aspherical, or else entirely without rotational symmetries. As illustrated in FIG. 1A, concavely and convexly shaped unevennesses are formed at the top side of the substrate 2, such that the actual surface form of the mirror 1 deviates from a—in the present example planar—desired surface form.

A reflective coating is generally required in order to measure the surface form of the mirror 1 using measurement methods at the used wavelength. In the case of the example shown in FIGS. 1A-1C for the purpose of measuring the surface form, the first group 3 of layers 3a, 3b is applied to the substrate 2, which group is configured to be reflective for measurement radiation at a desired wavelength in the range of between 5 nm and 30 nm. Interferometric methods can be used for measuring the mirror 1 shown in FIG. 1A. These include e.g. shearing interferometry, point-diffraction interferometry, the Foucault method, the Ronchi test, the Hartmann test or the Shack-Hartmann test. A description of these known methods can be found in EP 1306698 A1, for example.

However, the measurements can also be effected at different wavelengths than the used wavelength, e.g. in the visible wavelength range.

As the result of these measurements, the actual surface form is obtained, that is to say accurate indications about the actual surface form of the present mirror 1. If the measurement of the surface form reveals that the actual surface form deviates from the wanted surface form (desired surface form) then a correction of the surface form is required.

In order to correct the surface form, a correction layer 5 is applied to the first group 3 of layers 3a, 3b as is illustrated in FIG. 1B. The correction layer 5 can be processed with the aid of ion beam figuring or some other suitable method, i.e. a layer thickness variation in the correction layer 5 can be produced by local layer removal, without a significant roughening of the correction layer 5 occurring. Materials suitable for this purpose are e.g. Si, $SiO_2$, SiC, C, Ru, Ni. These materials are typically approximately transparent to radiation in the range of between approximately 5 nm and approximately 30 nm, in particular at the used wavelength $\lambda_B$ of approximately 13.5 nm, given the typically used thicknesses of the correction layer 5 in the nanometers range, on account of their absorption coefficient. The correction layer 5 can, if appropriate, additionally also serve for compensating for stresses in the reflective coating.

After the correction of the surface form of the mirror 1 by the processing of the correction layer 5, said surface form can be measured again in order to check whether the desired surface form has been attained. The desired surface form is often not attained by one correction step, such that a renewed correction of the surface form by means of a processing of the correction layer 5 is required. As is shown in FIG. 1b, the actual surface form of the mirror 1 is adapted to the wanted (planar) desired surface form using the (if appropriate multiple) correction.

After the desired surface form has been attained, the second group 4 of layers 4a, 4b is applied to the correction layer 5, said second group being configured to reflect radiation at the used wavelength $\lambda_B$. After the second group 4 of layers 4a, 4b has been applied, the surface form can be measured again. If it turns out that after the second group 4 of layers 4a, 4b has been applied, the tolerance range of the surface form, i.e. the permissible deviation from the desired surface form, has been exceeded, it is necessary, if appropriate, to remove the entire reflective coating from the substrate 2 and to coat the latter anew.

Figure 6:
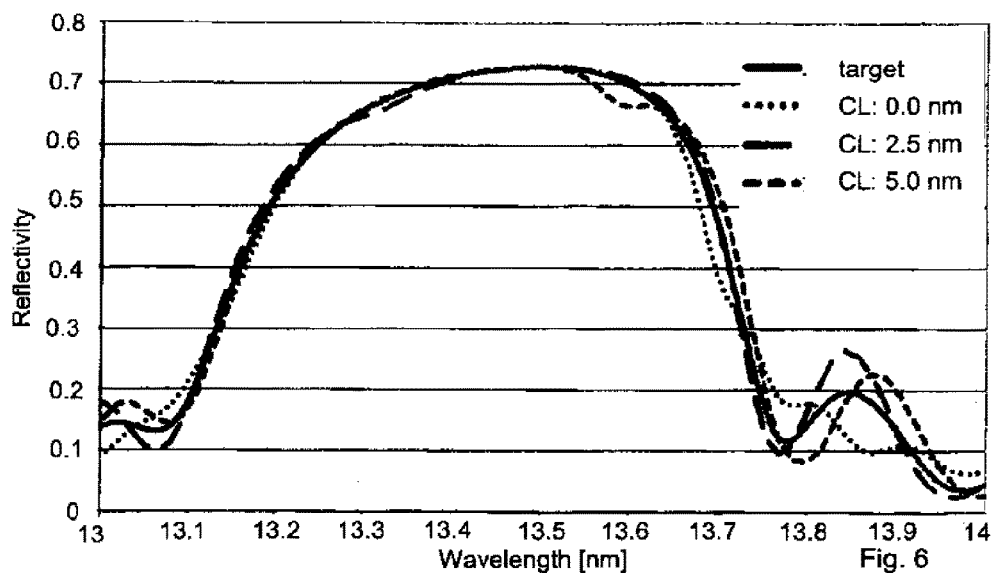
FIG. 6 shows an illustration of the reflectivity of the mirror from FIG. 1C for different thicknesses of the correction layer.

The correction of the surface form as described above in association with FIGS. 1A-1C is described in DE 10 2009 029 471 A1, the entirety of which is incorporated by reference in the content of this application. However, the introduction of the correction layer 5 into the reflective coating 3, 4 has effects on the wavelength-dependent reflectivity of the mirror 1, as illustrated below with reference to FIG. 6. FIG. 6 shows the desired reflectivity spectrum ("target") of the mirror 1 as a solid line, which is approximated well by a reflective coating 3, 4 without a correction layer 5 ("CL: 0.0 nm"). If a correction layer 5 having a thickness of 2.5 nm ("CL: 2.5 nm") and of 5.0 nm ("CL: 5.0 nm") is introduced between the first group 3 and the second group 4, the full width at half maximum of the reflectivity curve decreases and undesired local minima of the reflectivity form in the region around the reflection maximum at the used wavelength $\lambda_B$.

The effect shown in FIG. 6 occurs as a result of the fact that the two highly reflective coatings in the form of the first and second groups 3, 4 together with the intervening processed correction layer 5 form a configuration similar to an etalon or a laser cavity in a VCSEL (vertical cavity surface emitting laser). The greater the transparency of the layer construction above the first group 3 of layers 3a, 3b to EUV radiation, the greater this effect becomes.

Figure 7:
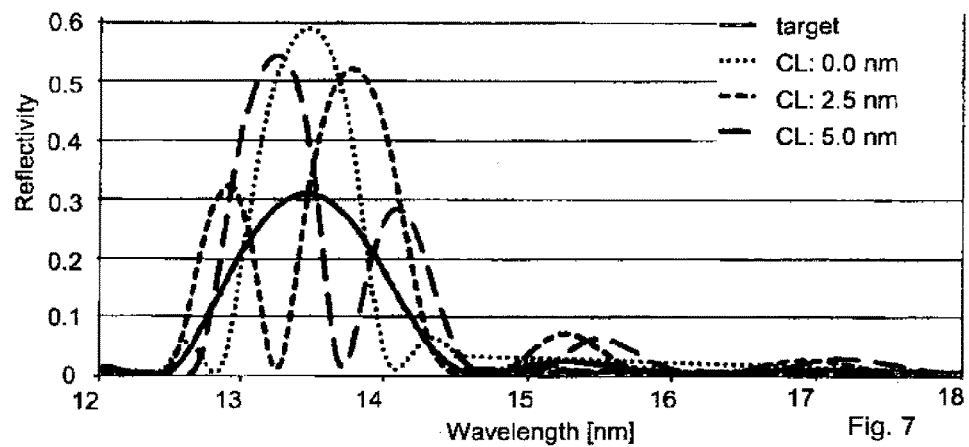
FIG. 7 shows an illustration analogous to FIG. 6, in which the second group of layers has ten layer periods.

In FIG. 7, for the same thicknesses of the correction layer 5 as in FIG. 6, the number of layers 4a, 4b of the second group 4 is reduced to ten periods, i.e. to twenty layers 4a, 4b, as may be the case e.g. in broadband reflective coatings. In FIG. 7, the effect of the correction layer 5 is clearly discernable already in the case of a theoretical thickness of 0 nm: the layer stacks of the first group 3 and of the second group 4 are superimposed constructively, such that the desired broadband nature of the reflection curve is no longer provided. If the layer thickness of the correction layer 5 is increased analogously to FIG. 6, then the reflectivity spectrum varies extremely, i.e. a plurality of reflection maxima form which no longer correspond to the used wavelength $\lambda_B$.

These disadvantages are overcome if an optical decoupling between the first group 3 of layers 3a, 3b and the second group 4 of layers 4a, 4b is carried out, to be precise, by a decoupling coating being introduced between the two groups 3, 4, which prevents EUV radiation from penetrating into the first group 3 of layers 3a, 3b, since the decoupling coating shields the incident EUV radiation. There are a number of possibilities for realizing the decoupling coating, some of which are described below with reference to FIGS. 2A-2C to FIGS. 5A-5C.

Figures 2A, 2B, 2C:
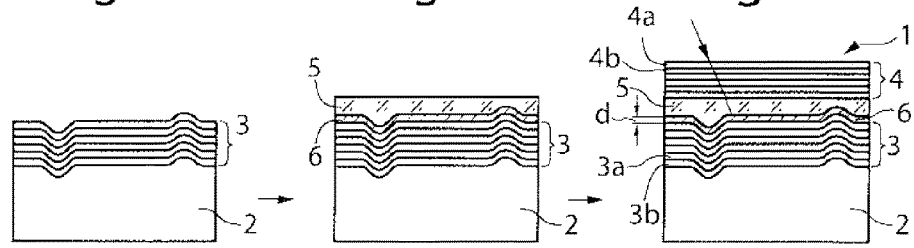
FIGS. 2A-2C show an illustration analogous to FIGS. 1A-1C, in which a decoupling coating in the form of an absorption layer is applied on top of the first group of layers.

FIGS. 2A-2C show a mirror 1 which differs from the mirror 1 from FIGS. 1A-1C in terms of a decoupling coating in the form of an absorption layer 6, which is arranged between the first group 3 of layers 3a, 3b and the correction layer 5. The absorption layer 6 is formed from a material having a high absorption coefficient for the incident EUV radiation, such that the impinging EUV radiation is completely absorbed and does not reach the first group 3 of layers 3a, 3b, as indicated in FIG. 2C. For this purpose, the absorption layer 6 can be formed for example from a material selected from the group Ni, Ag, Ac, Te, Cu, Co, Sn, Zn, Pt, Au, W, Fe for a used wavelength of 13.5 nm or else Al, Co, Cu, Ir, Os, Ni, Fe, Hf, Os, Pt, Ta, W, Zn for a used wavelength of 7 nm or else alloys or chemical compounds such as MoSi, CoSi, WSi, SiN, SiO, MoO, CoO, NiO. For completely shielding the first group 3 of layers 3a, 3b, the absorption layer 6 must be applied with a sufficient thickness d, which is typically more than 50 nm.

Figure 8:
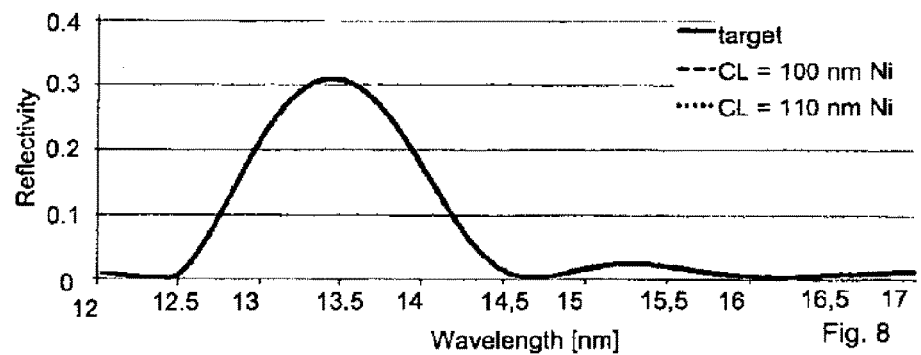
FIG. 8 shows an illustration analogous to FIG. 7 for the mirror in accordance with FIG. 2C.

If the first group 3 of layers 3a, 3b is completely shielded by the absorption layer 6, it is possible, even with a small number of layers 4a, 4b of the second layer group 4, e.g. ten pairs of layers 4a, 4b, for the desired reflectivity spectrum of the mirror 1 to be precisely reproduced even in the case of different, large thicknesses d of the correction layer 5 (of 100 nm and 110 nm), as can be discerned with reference to FIG. 8, in which only one reflectivity curve can be discerned since all three reflectivity curves (target curve and curves for d=100 nm and d=110 nm) lie one above another.

Figures 3A, 3B, 3C:
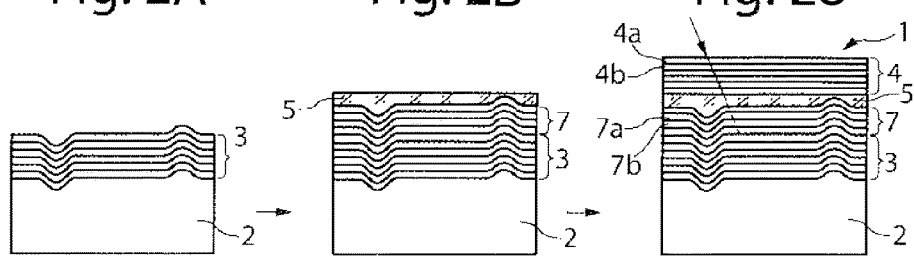
FIGS. 3A-3C show an illustration analogous to FIGS. 2A-2C, in which the decoupling coating is applied in the form of a reflective coating having a reflection maximum outside the used wavelength range of the mirror.

A further possibility for realizing a decoupling coating is illustrated in FIGS. 3A-3C, in which the decoupling coating 7 comprises a plurality of first layers 7a and second layers 7b, which are arranged alternately one above another and which are formed from silicon and molybdenum in the example described here. The thicknesses of the first layers 7a and of the second layers 7b define the period length of the decoupling coating 7 and are chosen such that the reflectivity maximum of the decoupling coating 7 occurs at a wavelength $\lambda_E$ which deviates from the used wavelength $\lambda_B$ (here: 13.5 nm) by more than 2 nm, in particular by more than 3 nm and which is $\lambda_E$=17 nm for example in FIG. 8.

The wavelength $\lambda_E$ of the reflectivity maximum of the decoupling coating 7 can also be further away from the used wavelength $\lambda_B$, e.g. 11 nm or less or 18 nm or higher. A decoupling coating 7 configured in this way likewise prevents an optical interaction between the first group 3 of layers 3a, 3b and of the second group 4 of layers 4a, 4b, such that the first group 3 of layers 3a, 3b has no influence on the reflectivity spectrum of the mirror 1. In contrast to the illustration shown in FIGS. 2A-2C and in FIGS. 3A-3C, the correction layer 5 can also be arranged below the decoupling coating 6, 7.

Figures 4A, 4B, 4C:
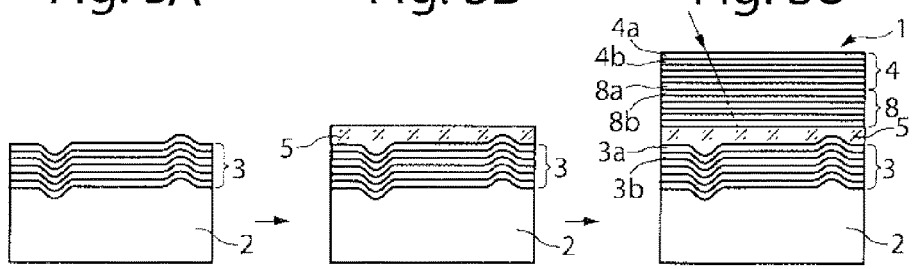
FIGS. 4A-4C show an illustration analogous to FIGS. 1A-1C, in which a decoupling coating having a third group of layers in a periodic arrangement is applied on top of the correction layer.

A further possibility for realizing a decoupling coating is illustrated in FIGS. 4A-4C, in which the decoupling coating consists of a third group 8 of layers 8a, 8b in a periodic arrangement, the layer materials and period length of which correspond to those of the second group 4 of layers 4a, 4b. Since the third group 8 directly adjoins the second group 4, the association of the layers 4a, 4b, 8a, 8b with the second and third groups 4, 8 cannot be differentiated in the case of the mirror 1 shown in FIG. 4c. However, the total number of layers 4a, 4b, 8a, 8b of the second and third groups 4, 8 is greater than in the case of a conventional reflective coating for an EUV mirror 1, i.e. the number of layer pairs or layer periods is 50 or more, preferably 60 or more, in particular 70 or more. As a result of the high number of layers 4a, 4b, 8a, 8b it is ensured on account of reflection and absorption that no EUV radiation penetrates through to the first group 3 of layers 3a, 3b, as is indicated in FIG. 4C.

Figures 5A, 5B, 5C:
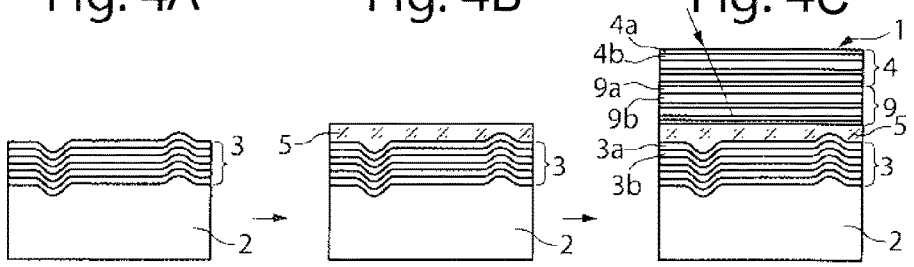
FIGS. 5A-5C show an illustration analogous to FIGS. 4A-4C, in which the decoupling coating has a third group of layers in an aperiodic arrangement.

The reflective coating shown in FIGS. 5A-5C differs from that shown in FIGS. 4A-4C merely in that the second group 4 of layers 4a, 4b and the third group 9 of layers 9a, 9b, which forms the decoupling coating, are not arranged in a periodic sequence, but rather in an aperiodic sequence, i.e. the layers 4a, 4b, 9a, 9b or the layer pairs do not have a uniform thickness or period length. Such an aperiodic coating produces a more broadband reflection spectrum than the periodic arrangement illustrated in FIGS. 4A-4C. In the case of an aperiodic arrangement, too, the layer materials of the second group 4 and of the third group 9 typically correspond and in general it is not possible to perform an unambiguous assignment of the layers 4a, 4b, 9a, 9b to the respective groups 4, 9. In this case, too, the penetration of EUV radiation into the first group 3 of layers 3a, 3b can be effectively prevented by virtue of the total number of layers 4a, 4b, 9a, 9b of the second and third groups 4, 9 being more than 50, preferably more than 80, in particular more than 100.

In a departure from the mirrors 1 shown in FIGS. 4A-4C and in FIGS. 5A-5C, the correction layer 5 can, if appropriate, also be arranged above the decoupling coating 8, 9. To summarize, the correction layer 5 in conjunction with the decoupling coating 6, 7, 8, 9 can perform a surface or wavefront correction on a mirror 1, without the reflectivity spectrum of the mirror 1 being impaired in this case. In particular, as a result of the application of a homogeneous decoupling coating, i.e. a decoupling coating having a constant thickness, processing with high convergence can be made possible. Effects as a result of e.g. different removal rates during ion beam correction as in EP 1947682 are thereby avoided. This ensures that the processing process converges on the desired surface form with few measurement/processing cycles. In a departure from the mirrors 1 shown in FIGS. 2A-2C to FIGS. 5A-5C, the thickness of the reflective coating can vary in a location-dependent manner, as is described for example in DE 10 2009 029 471 A1.

Figure 9:
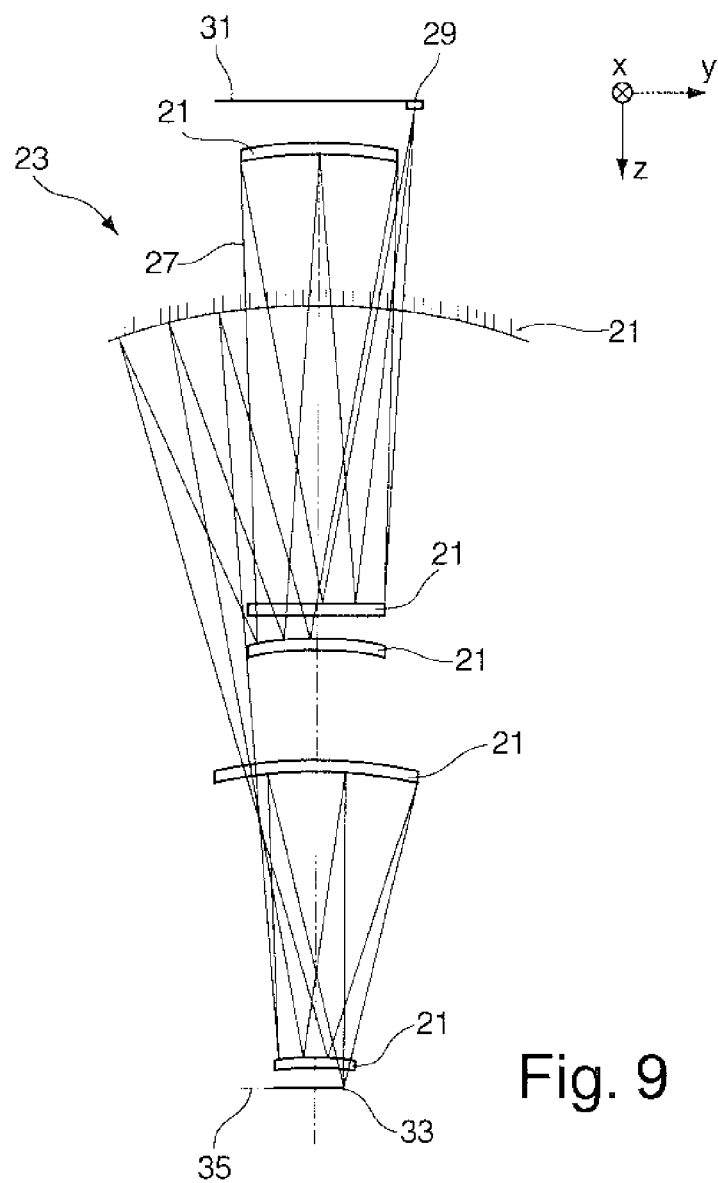
FIG. 9 shows a projection optical unit, in which a mirror according to the invention can be used, FIG. 10A schematically shows a plan view of a surface to be corrected.

FIG. 9 illustrates one exemplary embodiment of a projection optical unit 23 for EUV lithography, in which a mirror 1 as shown in FIGS. 2A-2C to FIGS. 5A-5C can be used. With the aid of the projection optical unit 23, a structure-bearing mask 29, arranged in an object plane 31, is imaged onto an image 33 in an image plane 35. A photosensitive layer that changes chemically as a result of the exposure is arranged in the image plane 35. This is referred to as a so-called lithographic step. In the present exemplary embodiment, the projection optical unit 23 comprises six mirrors 21 that image the structure-bearing mask 29 into the image plane 35. Such a projection optical unit 23 is usually diffraction-limited, such that the maximum possible resolution can be achieved only if the wavefront aberrations of the projection optical unit are sufficiently small. In the case of diffraction-limited projection optical units, it is necessary for the RMS value (root mean square) to be less than $1/14$ of the wavelength of the imaging light. In order to achieve this, the surface form of the mirrors 21 has to be set highly precisely. Furthermore, the mirrors 21 likewise have to be positioned very accurately.

Figure 10A:
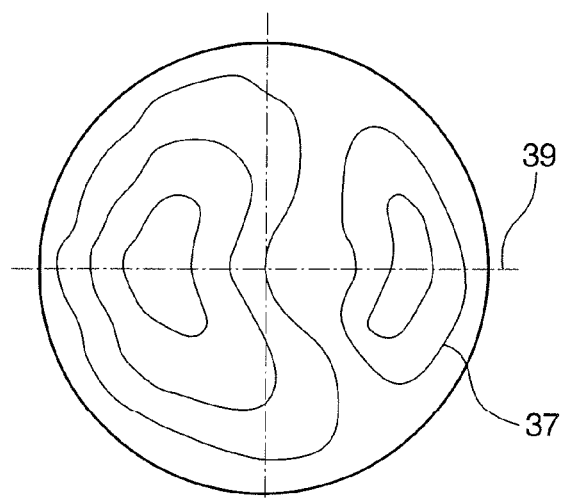
FIG. 10B shows a section through the surface to be corrected that is illustrated in FIG. 10*a*.
Figure 10B:
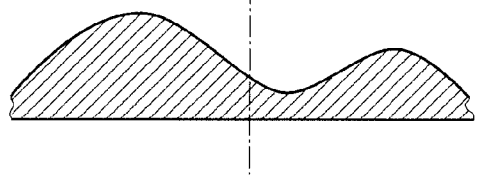

FIGS. 10A and 10B show by way of example the surface form to be corrected of a mirror. The deviation between the actual surface form and the desired surface form is illustrated with the aid of the contour lines 37 in FIG. 10A. Furthermore, FIG. 10B shows the height profile of this deviation along the line 39 in FIG. 10A. Such deviations shown can be determined e.g. with the aid of an interferometric measurement method.

Figure 11:
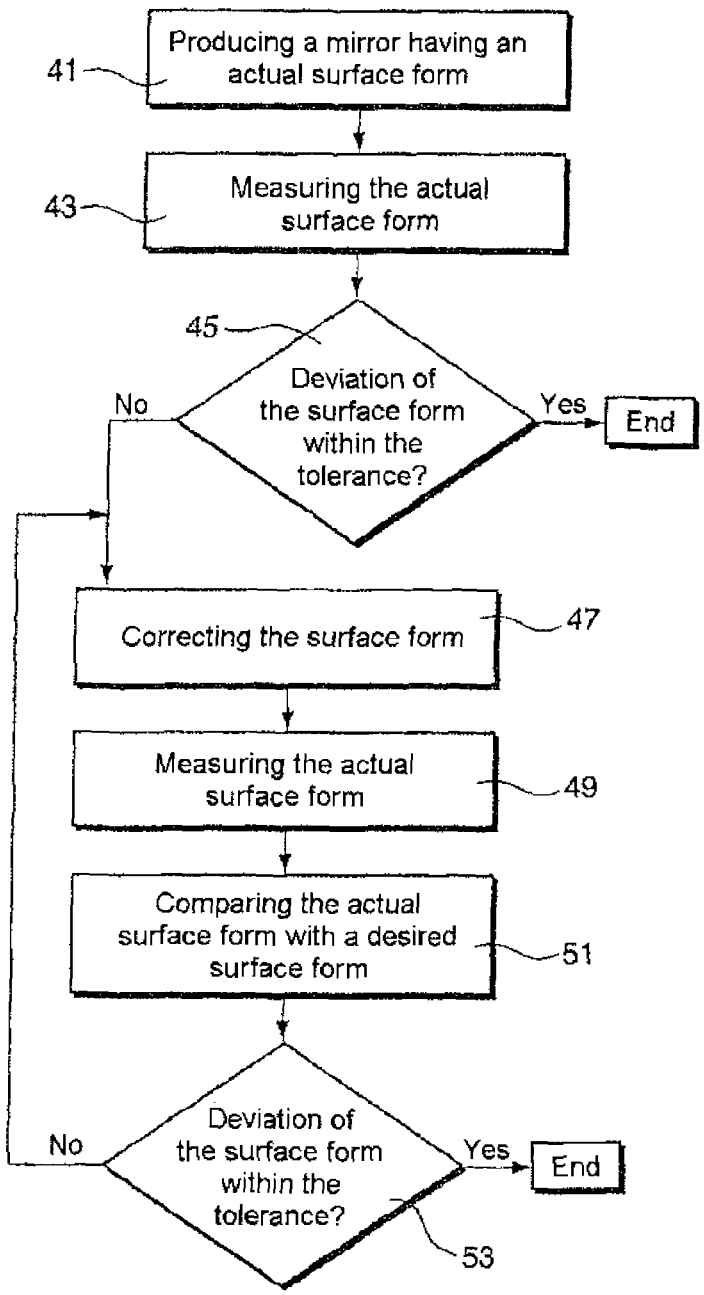
FIG. 11 shows a method for correcting the surface form of a mirror on the basis of a flowchart.

FIG. 11 illustrates a method for correcting a surface form of mirror by way of example on the basis of a flowchart. Firstly, a mirror having an actual surface form is produced in step 41. This mirror then already comprises a substrate and a reflective coating in the form of the first group 3 of layers 3a, 3b and, if appropriate, the correction layer 5. The actual surface form of the mirror is then measured accurately in step 43. For this purpose, an interferometric measurement method is usually used, such as is described e.g. in EP 1306698 A1. In step 45, the measured actual surface form is then compared with the wanted desired surface form. If the two surface forms correspond within the wanted tolerance, then the method is already ended and the second group 4 of layers 4a, 4b can be directly applied.

If there is a deviation of the surface form which lies outside the tolerance (which constitutes the normal case), then next, in step 47, a correction of the surface form is performed. This method step 47 comprises processing the correction layer 5 e.g. by ion beam figuring in the manner described above (and, if appropriate, applying the correction layer 5, if the latter was not actually applied before the measurement). After this correction of the surface form, the actual surface form is measured anew in step 49. In step 51 this actual surface form is then compared anew with the desired surface form. In method step 53, a check is then made to determine whether the actual surface form now corresponds to the desired surface form within the tolerance. If the result is positive, then the method is ended at this point.

If a deviation outside the tolerance still results, then the method is continued again with the correction of the surface form in step 47. Depending on the magnitude of the deviation to be corrected between actual surface form and desired surface form, a multiple application of this described correction loop of steps 47, 49, 51 and 53 may be required. After the end of the method, i.e. when the surface form is within the tolerance, the second group 4 of layers 4a, 4b is applied in a subsequent step. Before or after the application of the correction layer 5, the decoupling coating 6, 7, 8, 9 is also applied, as was described further above.

Figure 12:
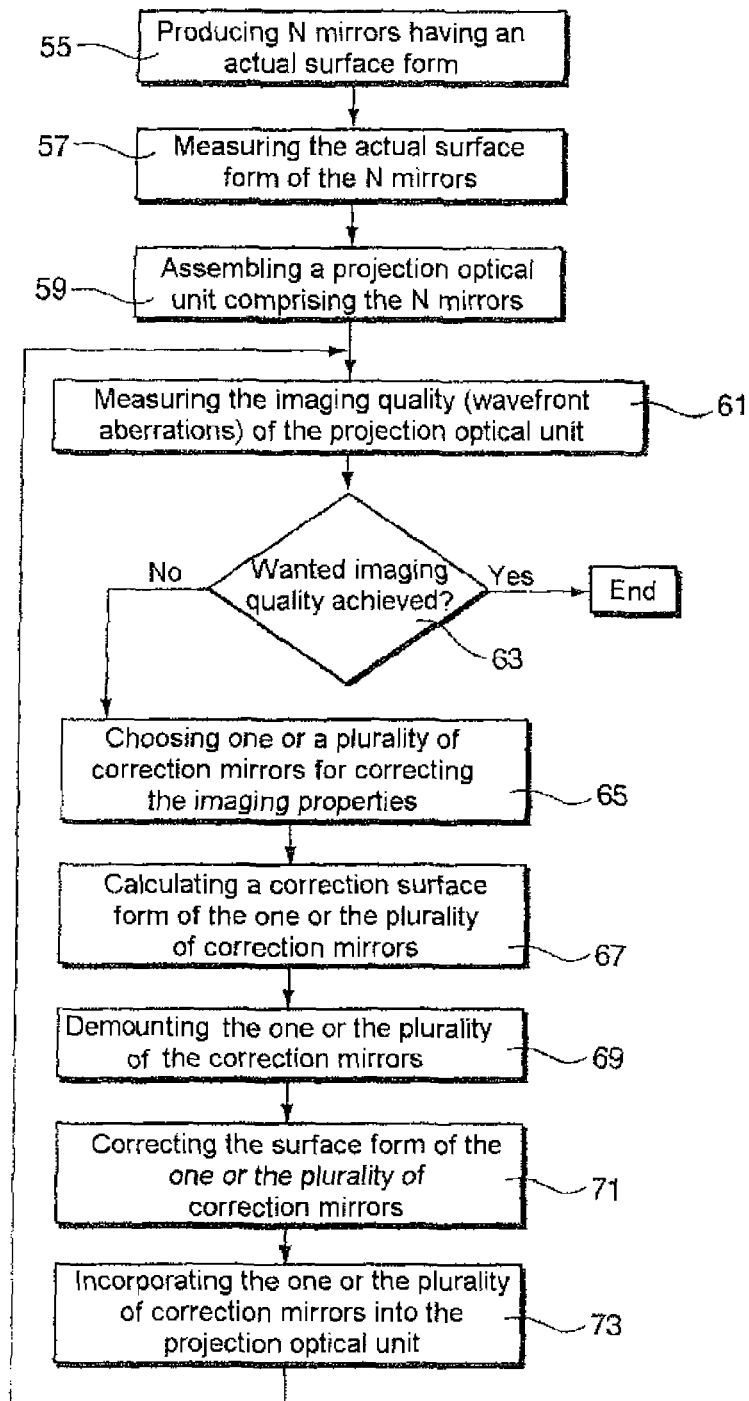
FIG. 12 shows a method for correcting the imaging quality of a projection optical unit by correcting the surface form of a mirror on the basis of a flowchart.

FIG. 12 illustrates a method for correcting the imaging properties of a projection optical unit of an EUV lithography apparatus on the basis of a flowchart. A plurality N of mirrors required for the projection optical unit are produced in a first step 55. On account of the production accuracy, these N mirrors have an actual surface form that may deviate from the wanted desired surface form. In an optional step 57, the present actual surface form of the N mirrors is measured with the aid of an interferometric measurement method. It becomes clear from the further method that an exact knowledge of the actual surface form of all N mirrors is not absolutely necessary for carrying out the method if the deviation of the actual surface form from the wanted desired surface form is not all that large. Therefore, step 57 can be dispensed with, if appropriate.

In the next step 59, a projection optical unit is assembled from the N mirrors. The imaging properties of the projection optical unit are then measured in step 61. The wavefront aberrations of the entire projection lens or of the projection optical unit are measured in this step 61. This likewise takes place with the aid of interferometric measurement methods, such as, for example, using the methods described in EP 1306698 A1. Method step 63 then involves checking whether the wavefront aberrations of the projection optical unit are small enough. For a good imaging quality of the projection optical unit it is necessary for the RMS value of the wavefront aberrations to be less than $1/14$ of the wavelength of the imaging light used. If the wavefront aberrations are already small enough, then the method is ended at this point. Otherwise, it is necessary to perform a correction on the projection optical unit. Besides altering the position of individual mirrors within the projection optical unit, it is possible to perform a correction of the wavefront aberrations by correcting the surface form of one or more mirrors of the projection optical unit. In this case, it is not absolutely necessary to carry out a correction of the surface form of all mirrors of the projection optical unit.

Depending on the specific optical design of the projection optical unit, it may suffice if a correction of the surface form is carried out on some, in particular only on one of the mirrors. From the optical design of the projection optical unit it is possible to determine, for example, how the wavefront aberrations of the projection optical unit change if the surface form of a specific mirror is altered. It may emerge, for example, that in the case of a first mirror, only a small change of the surface form is required for correcting the wavefront aberrations, whereas, in the case of a different second mirror, a much larger change of the surface form is required. Furthermore, specific profiles of the wavefront aberrations of the projection optical unit can be corrected only with the aid of altering the surface form of mirrors which have a specific position within the imaging beam path of the projection optical unit.

For this reason, the next step 65 involves making a suitable choice of correction mirrors which are particularly suitable for bringing about a correction of the wavefront aberration by altering the surface form. In step 67 a correction surface form is then calculated for this choice of correction mirrors with the aid of the measured wavefront aberrations and the optical design of the projection optical unit. If the actual surface form of all N mirrors was measured in a step 57 and the exact position of all N mirrors is known, the surface form of the correction mirrors can be calculated absolutely. If a measurement of the actual surface form was dispensed with in step 57, then only a required relative change of the surface form of the correction mirrors can be determined from the wavefront aberrations and the optical design.

Both cases are brought together hereinafter under the term correction surface form. A correction surface form can therefore be understood to mean an absolute surface form of the correction mirror or else the required relative change of the surface form of the correction mirror. It is often easier to calculate only the required change of the surface form, since the absolute actual surface form and position of all the mirrors is not necessarily known accurately enough. Therefore, only the required difference with respect to the possibly unknown actual surface form is calculated. Step 69 consists in demounting the one or the plurality of correction mirrors chosen in the preceding steps. Next, step 71 involves carrying out a correction of the surface form of the one or the plurality of correction mirrors with the aid of the calculated correction surface form. In this case, the correction of the surface form of the one or the plurality of correction mirrors is effected with the aid of a correction method as described with reference to FIG. 11. In the next step 73, the correction mirrors treated in this way are incorporated into the projection optical unit again.

The imaging quality of the projection optical unit can then be determined once more in method step 61. A check is then made in method step 63 to determine whether the measured wavefront aberrations are small enough, such that a sufficient imaging quality is ensured. If this is the case, then the method according to the invention is ended at this point. Otherwise, a further correction loop is carried out, comprising steps 65, 67, 69, 71, 73. On account of the stringent requirements made of the wavefront aberrations of the projection optical unit, it may be necessary that the correction loop described must be carried out a number of times until a sufficient imaging quality is achieved.

The method described with reference to FIG. 12 can be carried out with mirrors which have only the first group 3 of layers 3a, 3b. Alternatively, on a correction mirror the reflective coating can be completely removed and applied again in the manner described in association with FIGS. 2a-c to FIGS. 5a-c, in order to correct the surface form of the correction mirror before the latter is incorporated into the projection optical unit again.

The mirrors 1 produced in the manner described above can advantageously be used not only in a projection optical unit 23 but also in other optical arrangements, for example in an illumination system of an optical system in the form of an EUV lithography apparatus or the like.

What is claimed is:

1. A mirror for extreme ultraviolet (EUV) lithography, comprising:
a substrate and a reflective coating,
wherein the reflective coating comprises a first group of layers and a second group of layers,
wherein the first group and the second group of layers are configured respectively to reflect radiation having a used wavelength (LB) between 5 nm and 30 nm,
wherein the first group of layers is arranged between the substrate and the second group of layers, and
wherein the reflective coating further comprises a decoupling coating arranged between the first group and the second group of layers,
wherein the decoupling coating is configured to decouple optically the second group of layers from the first group of layers by preventing the radiation having the used wavelength from reaching the first group of layers, and
wherein the decoupling coating comprises at least one absorption layer configured to absorb the radiation having the used wavelength ($\lambda_B$) between 5 nm and 30 nm.

2. The mirror according to claim 1, further comprising a correction layer having a layer thickness variation correcting a surface form of the mirror and arranged between the first group and the second group of layers.

3. The mirror according to claim 2, wherein the material of the correction layer is selected from the group consisting of: Si, $SiO_2$, SiC, C, Ru, Ni.

4. The mirror according to claim 2, wherein the correction layer adjoins the first group of layers or the second group of layers.

5. The mirror according to claim 1, wherein the absorption layer is formed from at least one material selected from the group consisting of: Ni, Ag, Ac, Te, Cu, Co, Sn, Zn, Pt, Au, W, Fe, Al, Ir, Os, Hf, Ta.

6. The mirror according to claim 1, wherein the absorption layer is formed from at least one alloy or chemical compound.

7. The mirror according to claim 1, wherein the absorption layer has a thickness of more than 50 nm.

8. The mirror according to claim 1, wherein the second group comprises a number of layers which is less than or equal to 20.

9. A projection optical unit for EUV lithography, comprising at least one mirror as claimed in claim 1.

10. An optical system for EUV lithography, comprising at least one mirror as claimed in claim 1.

11. The mirror according to claim 1, wherein the absorption layer is formed from at least one alloy or chemical compound selected from the group consisting of: MoSi, CoSi, WSi, SiN, SiO, MoO, CoO, NiO.

12. A method for correcting a surface form of a mirror for EUV lithography comprising a substrate and a reflective coating, the method comprising:
applying a first group of layers of the reflective coating to the substrate,
applying a second group of layers of the reflective coating to the first group of layers, wherein the first group and the second group of layers are respectively configured to reflect radiation at a used wavelength ($\lambda_B$) between 5 nm and 30 nm, applying a decoupling coating to optically decouple the first group and the second group of layers after applying the first group of layers and before applying the second group of layers, wherein the decoupling coating prevents the radiation having the used wavelength from reaching the first group of layers, and correcting the surface form of the mirror by producing or altering a layer thickness variation of the reflective coating.

13. The method according to claim 12, further comprising measuring the surface form of the mirror after applying the first group of layers and before applying the second group of layers.

14. A method for correcting imaging properties of a projection optical unit for EUV lithography, comprising a method for correcting a surface form of at least one mirror of the projection optical unit according to claim 12.

15. A method for correcting imaging properties of a projection optical unit for EUV lithography, comprising:
determining wavefront aberrations of the projection optical unit,
calculating a correction surface form of at least one mirror from the wavefront aberrations of the projection optical unit, and
correcting a surface form of the at least one mirror according to a method as claimed in claim 12.

16. The method according to claim 12, further comprising:
applying a correction layer to correct the surface form of the mirror by producing or altering a layer thickness of the correction layer.

17. The method according to claim 16, wherein producing or altering a layer thickness variation of the correction layer comprises ion beam figuring of the correction layer.

18. A mirror for extreme ultraviolet (EUV) lithography, comprising:
a substrate and a reflective coating,
wherein the reflective coating comprises a first group of layers and a second group of layers,
wherein the first group and the second group of layers are configured respectively to reflect radiation having a used wavelength (LB) between 5 nm and 30 nm,
wherein the first group of layers is arranged between the substrate and the second group of layers,
wherein the reflective coating further comprises a decoupling coating arranged between the first group and the second group of layers,
wherein the decoupling coating is configured to decouple optically the second group of layers from the first group of layers by preventing the radiation having the used wavelength from reaching the first group of layers,
wherein the decoupling coating comprises a plurality of first layers and second layers arranged alternately one above another,
wherein the first layers comprise a first material, the refractive index of which for radiation having a wavelength between 5 nm and 30 nm is greater than the refractive index of a second material, which the second layers comprise, and
wherein the decoupling coating has a reflectivity maximum at a wavelength ($\lambda_E$) that deviates from the used wavelength ($\lambda_B$) by more than 2 nm.

19. A mirror for extreme ultraviolet (EUV) lithography, comprising:

a substrate and a reflective coating,
wherein the reflective coating comprises a first group of layers and a second group of layers,
wherein the first group and the second group of layers are configured respectively to reflect radiation having a used wavelength ($\lambda_B$) between 5 nm and 30 nm,
wherein the first group of layers is arranged between the substrate and the second group of layers,
wherein the reflective coating further comprises a decoupling coating arranged between the first group and the second group of layers,
wherein the decoupling coating is configured to decouple optically the second group of layers from the first group of layers by preventing the radiation having the used wavelength from reaching the first group of layers,
wherein the decoupling coating comprises a third group of layers,
wherein the second and third groups of layers respectively comprise a plurality of first layers and second layers arranged alternately one above another in a periodic arrangement,
wherein the first layers comprise a first material, the refractive index of which for radiation having a wavelength between 5 nm and 30 nm is greater than the refractive index of a second material, which the second layers comprise, and
wherein a total number of pairs comprising the first and the second layers in the second and the third groups is more than 50.

20. A mirror for extreme ultraviolet (EUV) lithography, comprising:
a substrate and a reflective coating,
wherein the reflective coating comprises a first group of layers and a second group of layers,
wherein the first group and the second group of layers are configured respectively to reflect radiation having a used wavelength ($\lambda_B$) between 5 nm and 30 nm,
wherein the first group of layers is arranged between the substrate and the second group of layers,
wherein the reflective coating further comprises a decoupling coating arranged between the first group and the second group of layers,
wherein the decoupling coating is configured to decouple optically the second group of layers from the first group of layers by preventing the radiation having the used wavelength from reaching the first group of layers,
wherein the decoupling coating comprises a third group of layers,
wherein the second group and third group of layers respectively comprise a plurality of first layers and second layers arranged alternately one above another in an aperiodic arrangement, wherein the first layers comprise a first material, the refractive index of which for radiation having a wavelength between 5 nm and 30 nm is greater than the refractive index of a second material, which the second layers comprise, and
wherein a total number of the layers in the second group and the third group is more than 50.

* * * * *

UNITED STATES PATENT AND TRADEMARK OFFICE
CERTIFICATE OF CORRECTION

PATENT NO.        : 9,921,483 B2
APPLICATION NO.   : 14/981018
DATED             : March 20, 2018
INVENTOR(S)       : Oliver Dier et al.

Page 1 of 1

It is certified that error appears in the above-identified patent and that said Letters Patent is hereby corrected as shown below:

In the Claims

Column 16, Line 14, In Claim 1, delete "(LB)" and insert -- ($\lambda$B) --, therefor.

Column 17, Line 42, In Claim 18, delete "(LB)" and insert -- ($\lambda$B) --, therefor.

Signed and Sealed this
Twenty-third Day of July, 2019

Andrei Iancu
*Director of the United States Patent and Trademark Office*